United States Patent
Feismann et al.

(10) Patent No.: US 10,237,966 B2
(45) Date of Patent: Mar. 19, 2019

(54) ELECTRONIC DEVICE FOR A MOTOR VEHICLE

(71) Applicant: Aptiv Technologies Limited, St. Michael (BB)

(72) Inventors: Timo Feismann, Emsburen (DE); Matthias Rieke, Moenchengladbach (DE)

(73) Assignee: Aptiv Technologies Limited (BB)

( * ) Notice: Subject to any disclaimer, the term of this patent is extended or adjusted under 35 U.S.C. 154(b) by 0 days.

(21) Appl. No.: 15/914,228

(22) Filed: Mar. 7, 2018

(65) Prior Publication Data
US 2018/0263106 A1    Sep. 13, 2018

(51) Int. Cl.
| | |
|---|---|
| H05K 7/20 | (2006.01) |
| H05K 1/02 | (2006.01) |
| H02K 11/33 | (2016.01) |
| F04D 25/06 | (2006.01) |
| F04D 25/08 | (2006.01) |
| F04D 29/28 | (2006.01) |
| H02K 7/14 | (2006.01) |
| H02K 21/24 | (2006.01) |
| H05K 1/14 | (2006.01) |

(52) U.S. Cl.
CPC ......... *H05K 1/0203* (2013.01); *F04D 25/068* (2013.01); *F04D 25/08* (2013.01); *F04D 29/282* (2013.01); *H02K 7/14* (2013.01); *H02K 11/33* (2016.01); *H02K 21/24* (2013.01); *H05K 1/144* (2013.01); *H05K 7/20172* (2013.01); *H05K 7/20863* (2013.01); *H02K 2203/03* (2013.01); *H02K 2211/03* (2013.01); *H05K 2201/042* (2013.01); *H05K 2201/064* (2013.01); *H05K 2201/066* (2013.01); *H05K 2201/1003* (2013.01); *H05K 2201/1009* (2013.01)

(58) Field of Classification Search
CPC .......... H05K 7/20145; H05K 7/20154; H05K 7/20163; H05K 7/20181
See application file for complete search history.

(56) References Cited

U.S. PATENT DOCUMENTS

| | | | | |
|---|---|---|---|---|
| 4,790,374 A | * | 12/1988 | Jacoby | H01L 23/4093 165/185 |
| 5,158,136 A | * | 10/1992 | Azar | F28F 1/124 165/185 |
| 5,486,980 A | | 1/1996 | Jordan et al. | |
| 5,734,553 A | | 3/1998 | Hong | |
| 5,737,187 A | * | 4/1998 | Nguyen | G06F 1/203 165/185 |
| 5,873,407 A | * | 2/1999 | Wang | G06F 1/20 165/122 |

(Continued)

FOREIGN PATENT DOCUMENTS

WO    2012/066226 A1    5/2012

*Primary Examiner* — Adrian S Wilson
(74) *Attorney, Agent, or Firm* — Lawrence D. Hazelton (57) ABSTRACT

An electronic assembly including a cooling device comprises a cooling plate equipped, on its upper face, with a plurality of pin-fins; a first printed circuit board including at least one heat-generating zone bearing against the lower face of the cooling plate; each pin including a blowing means comprising a hub equipped with blades, the blades being arranged axially along each pin so as to be able to rotate about the pin, thus creating a flow of air for cooling the pins.

12 Claims, 5 Drawing Sheets

(56) References Cited

U.S. PATENT DOCUMENTS

| | | | | |
|---|---|---|---|---|
| 6,244,331 B1 * | 6/2001 | Budelman | ............... | F28F 3/022 |
| | | | | 165/121 |
| 7,120,018 B2 * | 10/2006 | Shen | ......................... | G06F 1/20 |
| | | | | 361/695 |
| 7,593,230 B2 * | 9/2009 | Abul-Haj | .................. | F28F 3/02 |
| | | | | 361/702 |

\* cited by examiner

ELECTRONIC DEVICE FOR A MOTOR VEHICLE

TECHNICAL FIELD OF INVENTION

The present invention relates to an electronic device for a motor vehicle, and more particularly to a heat dissipation device for a printed circuit board.

BACKGROUND OF INVENTION

Electronic control units on board motor vehicles increasingly comprise semiconductor components such as microcontrollers, signal-processing components or even power switches. The amount of heat generated by semiconductor devices is constantly increasing. It is generally known to provide heat sinks having cooling pillars that are used to transfer heat from an electronic component to the surrounding air. In the technical literature, the cooling pillars of the heat sinks are also called 'needles' or else 'pin-fins'. More commonly, the term used to denote a heat sink with cooling pillars is 'pin-fin heat sink'. Pin-fin heat sinks are also able to be applied to multi-component devices such as power supplies or else electronic control units.

In order to boost the heat dissipation capability of the heat sinks, it is known to use the convection heat transfer mechanism, either through natural convection or through forced convection by way of a blower.

However, this type of solution is not completely satisfactory for several reasons. A heat sink is generally not able to be scalable, that is to say that its size limits heat dissipation to a set maximum value since its dissipation surface area is fixed. Natural convection additionally does not generally make it possible to uniformly cool all of the pin-fins of the heat sink. Forced convection generally requires a complex implementation of a bulky blower above all of the pin-fins of the heat sink.

As a result, one objective of the present invention is to provide a pin-fin heat sink having an improved heat dissipation capability that overcomes the problems mentioned above. Other aims and advantages of the present invention will emerge in the light of the following description.

SUMMARY OF THE INVENTION

An electronic assembly including a cooling device comprises a cooling plate equipped, on its upper face, with a plurality of pin-fins; a first printed circuit board including at least one heat-generating zone bearing against the lower face of the cooling plate; each pin including a blowing means comprising a hub equipped with blades, the blades being arranged axially along each pin so as to be able to rotate about the pin, thus creating a flow of air for cooling the pins.

Each hub may be mounted so as to be able to rotate on a pin-fin. Each pin-fin may have a cylindrical overall shape with a circular base. Each pin-fin may comprise, at its free end, a shoulder on which the hub is mounted in abutment. The blades may be formed by rectilinear rods extending from the hub as far as their free end. Each rectilinear rod may include a blowing blade extending axially along each rod.

The electronic assembly may also comprise a rotation-driving device controlled by an electronic control circuit arranged on a second printed circuit board. The second printed circuit board may be arranged flat level above the free ends of the pin-fins. The electronic control circuit may be arranged on the face of the second printed circuit board, facing the hubs. Each hub may be mounted in rotation on the second printed circuit board. The rotation-driving device may be electromagnetic. The electromagnetic rotation-driving device may comprise, for each blowing means: three coils arranged on the second printed circuit board, forming a magnetic stator, and two permanent magnets arranged on the hub, forming a magnetic rotor.

Further features and advantages will appear more clearly on a reading of the following detailed description of the preferred embodiment, which is given by way of non-limiting example only and with reference to the accompanying drawings.

BRIEF DESCRIPTION OF DRAWINGS

Other features, aims and advantages of the invention will emerge upon reading the following detailed description, and with reference to the appended drawings, given by way of nonlimiting example and in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In order to facilitate the description, and in a nonlimiting manner, an orthogonal reference frame, comprising a longitudinal axis L, a transverse axis T and a vertical axis V, is defined. Orientations 'low', 'high', 'top', 'bottom', 'lower' and 'upper' are defined in the vertical direction.

Figure 1:
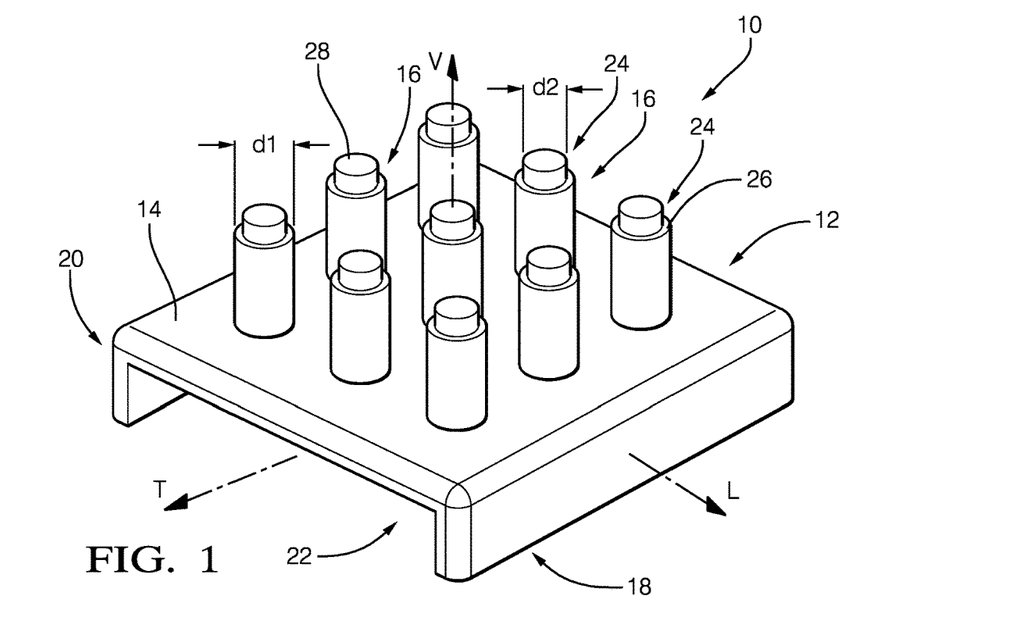
FIG. 1 is a schematic, perspective view of a cooling device comprising a plurality of pin-fins according to the invention.

In FIG. 1, a cooling device 10, provided for dissipating the heat of a heat-generating electronic component, comprises a cooling plate 12 arranged in a horizontal plane defined by the longitudinal axis and the transverse axis. The cooling plate 12 is equipped, on its upper face 14, with a plurality of pin-fins 16.

Overall, the cooling plate 12 is rectangular. Two lateral walls 18, 20 are arranged at two opposite ends of the cooling plate 12, so as to be able to keep the cooling plate 12 raised when it is positioned, for example, on a housing bottom, and therefore so as not to crush the electronic components bearing against the lower face 22 of the cooling plate 12.

The pin-fins 16 are arranged perpendicular to the cooling plate 12 and project therefrom in the direction of the vertical axis. According to the embodiment that is shown, the pin-fins 16 are arranged in rows aligned with the cooling plate 12. The pin-fins 16 could also be positioned in offset rows. The pin-fins 16 that are shown are overall of cylindrical shape with a circular base. Each pin-fin 16 comprises, at its free end 24, a shoulder 26 provided for receiving a hub of a blowing means for the pin 16, mounted in abutment against the shoulder 26. The shoulder 26 is formed by restricting the diameter of the circular base of the cylinder forming the pin over a small portion of the free end 24 of the pin-fin 16. The diameter of the circular base of the cylinder is termed main diameter d1, in opposition to the diameter of the portion of the free end 24, which is termed secondary diameter d2.

As an alternative, the pin-fins 16 could be of cylindrical shape with a rectangular base. As an alternative, the pin-fins 16 may be of uniform cylindrical shape, that it to say without their free ends 24 comprising a restriction forming a shoulder 26. In this case, a hub of a blowing means may be mounted in abutment directly on the upper face 28 of the free end 24 of the pin 16, or else may be mounted so as to be able to rotate about the pin 16 at the base of the pin, that is to say in abutment on the upper face 14 of the cooling plate 12.

Figure 2:
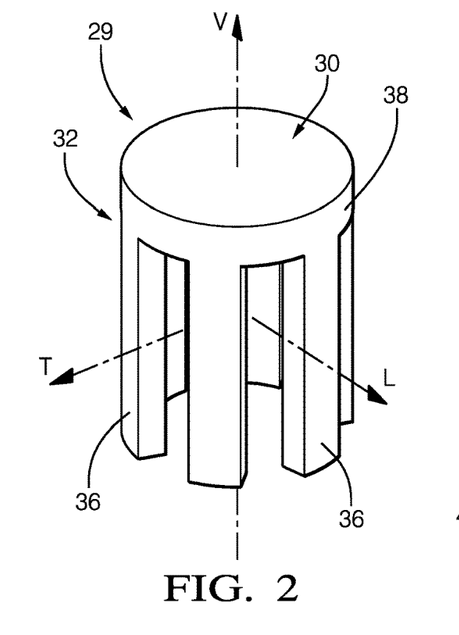
FIG. 2 is a schematic, perspective view of a first embodiment of a blowing means for the pin-fins of FIG. 1.

A first embodiment of a blowing means 29 for a pin-fin 16 is shown in FIG. 2. The blowing means 29 comprises a hub 30 equipped with blades 32. The hub 30 is of cylindrical overall shape with a circular base arranged in the horizontal plane. In order to be able to be inserted onto a pin-fin 16 such as described in FIG. 1, that is to say in order to come into abutment on the shoulder 26 of a pin-fin 16, the hub 30 comprises, at its centre, on its lower face (visible in FIG. 3), a blind hole 34 of a size complementary to the secondary diameter d2 of the free end 24 of the pin-fin 16.

The blades 32 of the blowing means 29 are formed by rectilinear rods 36 extending vertically downwards from the perimeter 38 of the hub 30. The rectilinear rods 36 are distributed regularly on the perimeter 38 of the hub 30. The rods 36 are ideally six or eight in number, along the main diameter d1 of the pin-fin 16.

The hub 30 has a diameter of size substantially greater than the main diameter d1 of the pin-fins 16, that is to say having a diameter enabling the rectilinear rods 36 to be able to rotate about the pin-fin 16 while at the same time being arranged as close as possible thereto so as to create a flow of air for cooling the pins 16.

Figure 3:
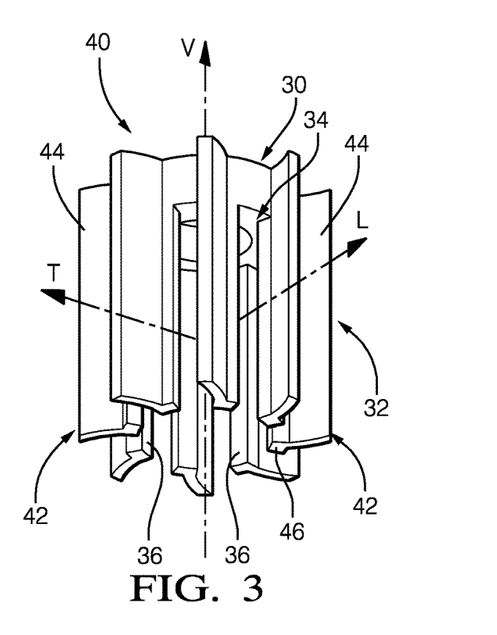
FIG. 3 is a schematic, perspective view of a second embodiment of a blowing means for the pin-fins of FIG. 1.

A second embodiment of a blowing means 40 is shown in FIG. 3. The blowing means 40 that is shown comprises, in addition to the structure of the blowing means 29 described by way of FIG. 2, blades 42 attached to the rectilinear rods 36. The blades 42 are in the form of rectangular paddles 44, one side of which extends vertically towards the free end 46 of the rectilinear rods 36 as far as the upper surface of the hub 30. The structure of this embodiment of the blowing means 40 is comparable to that of an impeller of a hydraulic device.

Figure 4:
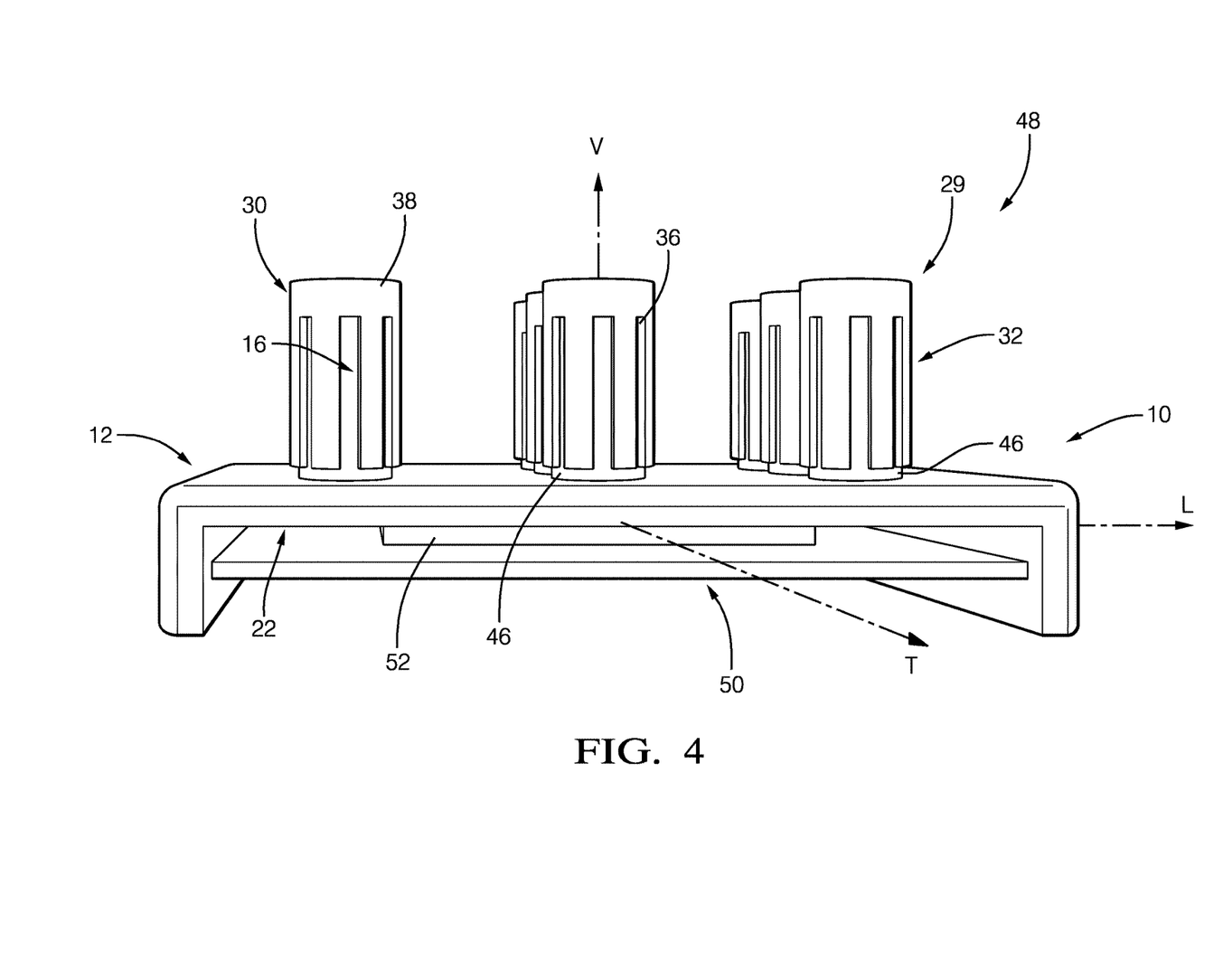
FIG. 4 is a schematic view of a first embodiment of an electronic assembly according to the invention including the cooling device of FIG. 1 equipped with the blowing means of FIG. 2.

A first embodiment of an electronic assembly 48 comprising the cooling device 10 of FIG. 1 equipped with the blowing means 29 of FIG. 2 is shown in FIG. 4. The electronic assembly 48 also comprises a first printed circuit board 50 comprising an electronic component 52 able to generate heat. For cooling purposes, the electronic component 52 bears on the lower face 22 of the cooling plate 12. More generally, the invention is not limited only to the cooling of an electronic component 52 able to generate heat, but extends to all of the zones of a printed circuit board that are able to generate heat, said zones able to generate heat also being able to bear against the lower face 22 of the cooling plate 12 by way of a thermal paste.

According to this first embodiment of the electronic assembly 48, each pin-fin 16 of the cooling device 10 of FIG. 1 is equipped with the blowing means 29 described in FIG. 2. The hub 30 of each blowing means 29 is mounted so as to be able to rotate on each pin-fin 16, so as to be able to drive the blades 32 about the pin-fin 16 on which said hub is mounted. More precisely, the cylindrical portion, of secondary diameter d2, of the free end 24 of each pin-fin 16 is inserted into the central blind hole 34 of each hub 30. The hub 30 is therefore mounted in abutment on the shoulder 26 formed by the restriction of the diameter of the pin-fin 16. The rectilinear rods 36 of each blowing means 29 extend vertically downwards, along each pin-fin 16, from the perimeter 38 of the hub 30 as far as their own free ends 46. The free ends 46 of the rectilinear rods 36 are virtually in contact with the cooling plate 12, such that they extend along virtually the entire length, in the vertical direction, of the pin-fin 16 on which the blowing means 29 is mounted.

When the device is subjected to a flow of air in a direction enabling the blades 32 of the blowing means 29 to rotate, the blowing means 29 generate a flow of air all around the pin-fin 16, thus increasing their heat dissipation capability, whereas, without the blowing means 29, the flow of air cools only that portion of the pin 16 with which it comes into contact.

It should be the case that, in the case of a rotation of the blades 32 of the blowing means by way of a flow of air, the second embodiment of the blowing means 40 described in FIG. 3, that is to say the blowing means 40 equipped with blades 42, will prove to be more effective but more bulky.

In addition, if the blowing means 29, 40 is made of a heat-conductive material, such as aluminium, the addition of the blowing means 29, 40 onto each pin-fin 16 makes it possible to increase the heat dissipation surface area of the cooling device 10, and therefore to boost the heat dissipation capability of the cooling device 10. It should also be noted that, in the case of a blowing means 40 comprising blades 42 made of aluminium, the useful heat dissipation surface area of the blowing means 40 is also increased, and therefore the heat dissipation of the electronic assembly 48 is improved.

Figure 5:
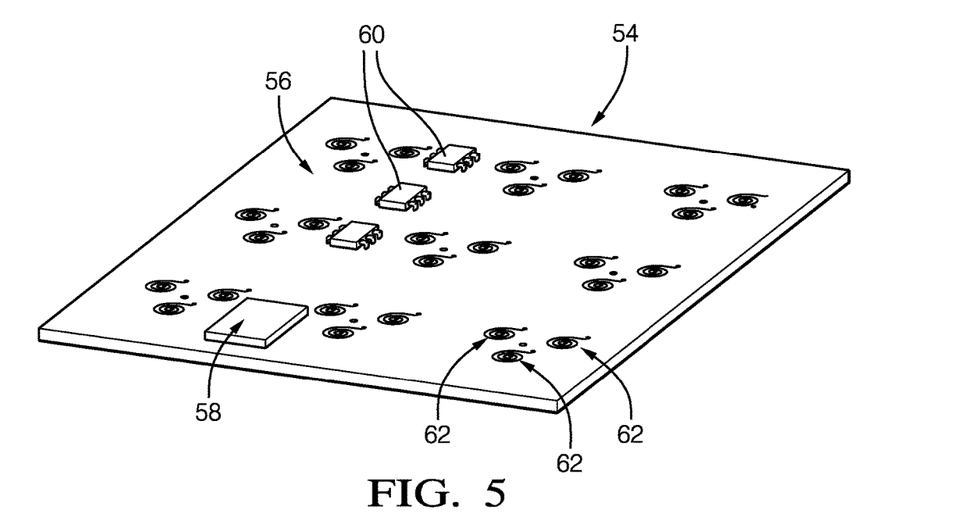
FIG. 5 is a schematic, perspective view of a printed circuit board on which an electronic circuit for rotationally controlling the blowing means for the pin-fins is mounted.

A second printed circuit board 54 comprising an electronic circuit 56 for rotationally controlling the blowing means 29, 40 is shown in FIG. 5. The second printed circuit board 54 comprises, on a single face, a microcontroller 58, electronic switches 60 based on field-effect transistors, and magnetic coils 62. The control circuit 56 is a magnetic control circuit, such as a magnetic stator. The microcontroller 58 controls the switches 60, allowing or not allowing a current to flow in the magnetic coils 62. The magnetic coils 62 are grouped into groups of three coils 62. According to the embodiment, the magnetic coils 62 are patterns in the shape of a round spiral that are printed on the second printed circuit board 54. Each group of three coils 62 is provided for controlling a magnetic rotor.

Figure 6:
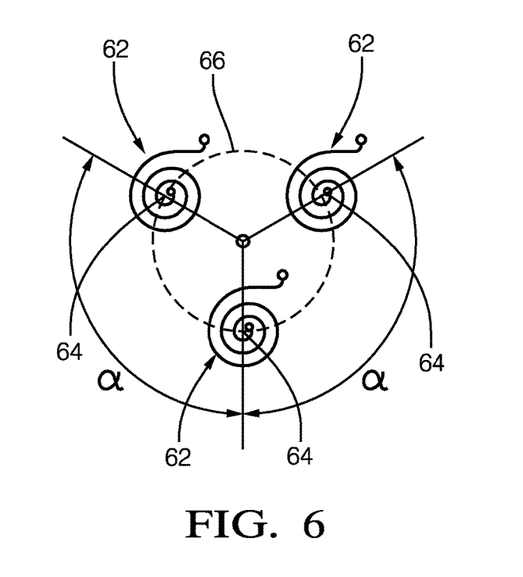
FIG. 6 is a schematic, detailed view of the coil system of the control circuit of FIG. 5.

In FIG. 5 and FIG. 6, the centres of the three spirals 64 are arranged regularly in a circle, and are therefore spaced apart from one another by an angle α of about 120 degrees. More precisely, the centres 64 of the three spirals are arranged on a virtual circle 66, shown by dotted lines in FIG. 6, with a radius substantially smaller than the radius of the cylindrical base of a hub of the blowing means described in FIG. 2, such that the three coils 62 are able to be coupled electromagnetically to a magnetic rotor mounted on the hub 30 of the blowing means 29, 40.

Those skilled in the art should recognize that other types of coil 62 may be entirely suitable for controlling a magnetic rotor. Those skilled in the art should also recognize that the control circuit 56 could be produced on a plurality of faces of a multilayer printed circuit board.

Figure 7:
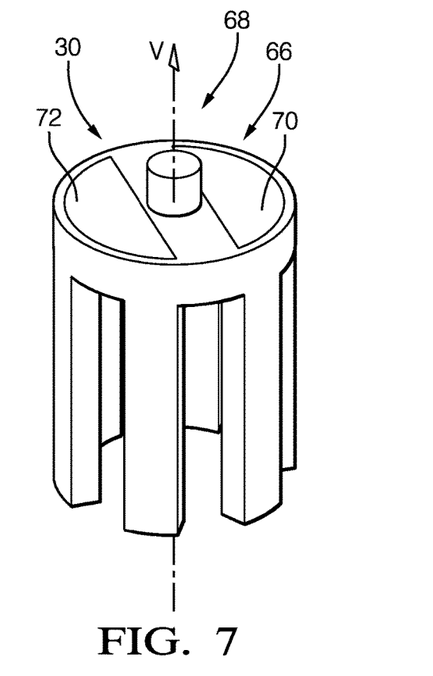
FIG. 7 is a schematic, perspective view of the blowing means of FIG. 2, equipped with two permanent magnets.

The blowing means 66 of FIG. 7 differs from the one shown in FIG. 2 only in that magnetic elements 68 are mounted on the hub 30. More precisely, two permanent magnets 70, 72 of opposite polarities (north-south) are arranged on the hub 30, such as a magnetic rotor, so as to interact with the coils 62 of the electronic control circuit 56.

Figure 8:
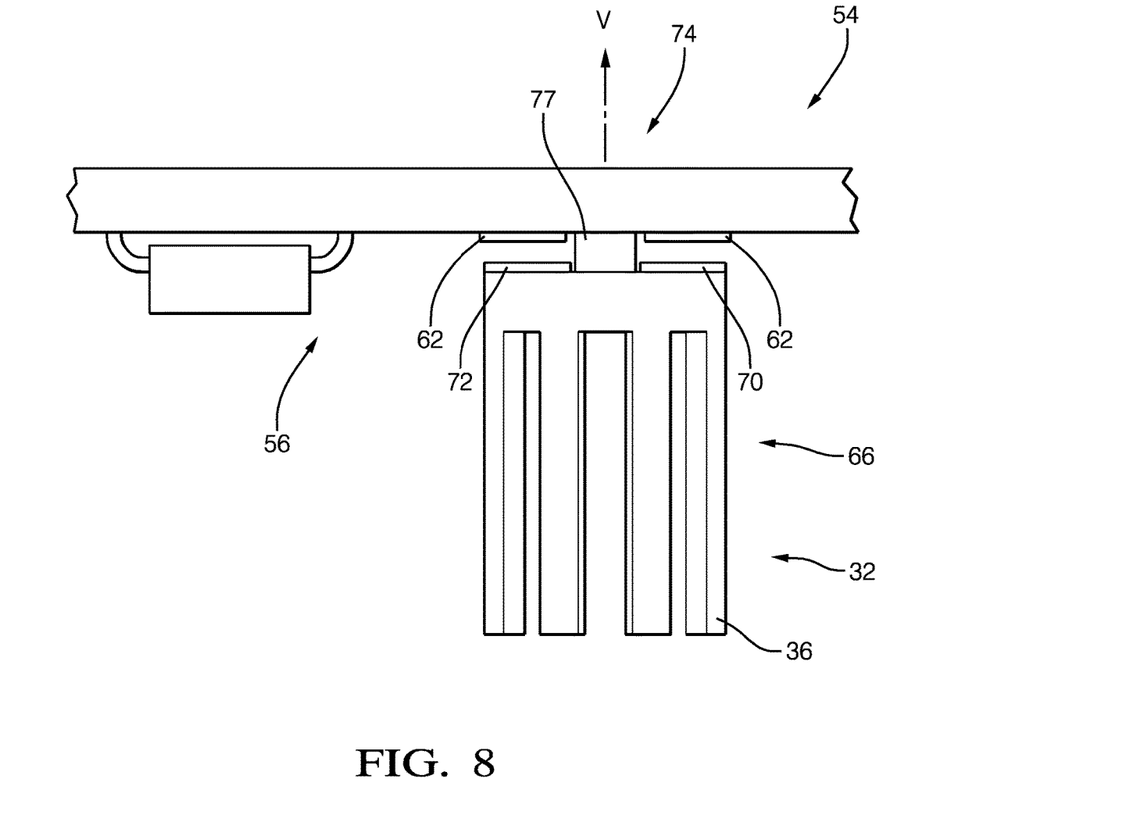
FIG. 8 is a schematic, sectional view of the blowing means of FIG. 7, mounted in rotation on the printed circuit board of FIG. 5.

In FIG. 8, the second printed circuit board 54 equipped with the electronic control circuit 56 described in FIG. 5 is attached to the blowing means 66 described in FIG. 7. A rotation-driving device 74 for driving the blowing means 66 in rotation is formed. Said rotation-driving device 74 comprises the electronic control circuit 56 of the second printed circuit board 54, the coils 62 of which are coupled electromagnetically to the two permanent magnets 70, 72 of the blowing means 66. In order to optimize the performance of the rotation-driving device 74, the blowing means 66 equipped with the two permanent magnets 70, 72 is mounted in rotation on the second printed circuit board 54, such that the two permanent magnets 70, 72 are arranged facing one another and as close as possible to the group of three coils 62 of the electronic control circuit 56. A rotation-fixing means 77 for securing the blowing means 66 in rotation connects the second printed circuit board 54 to the blowing means 66 between the centre of the virtual circle 66 on which the three coils 62 are arranged and the axis of rotation of the hub 30 of the blowing means 66.

As an alternative, the blowing means 29, 40 could be driven in rotation by non-magnetic devices, such as for example mechanical devices.

Figure 9:
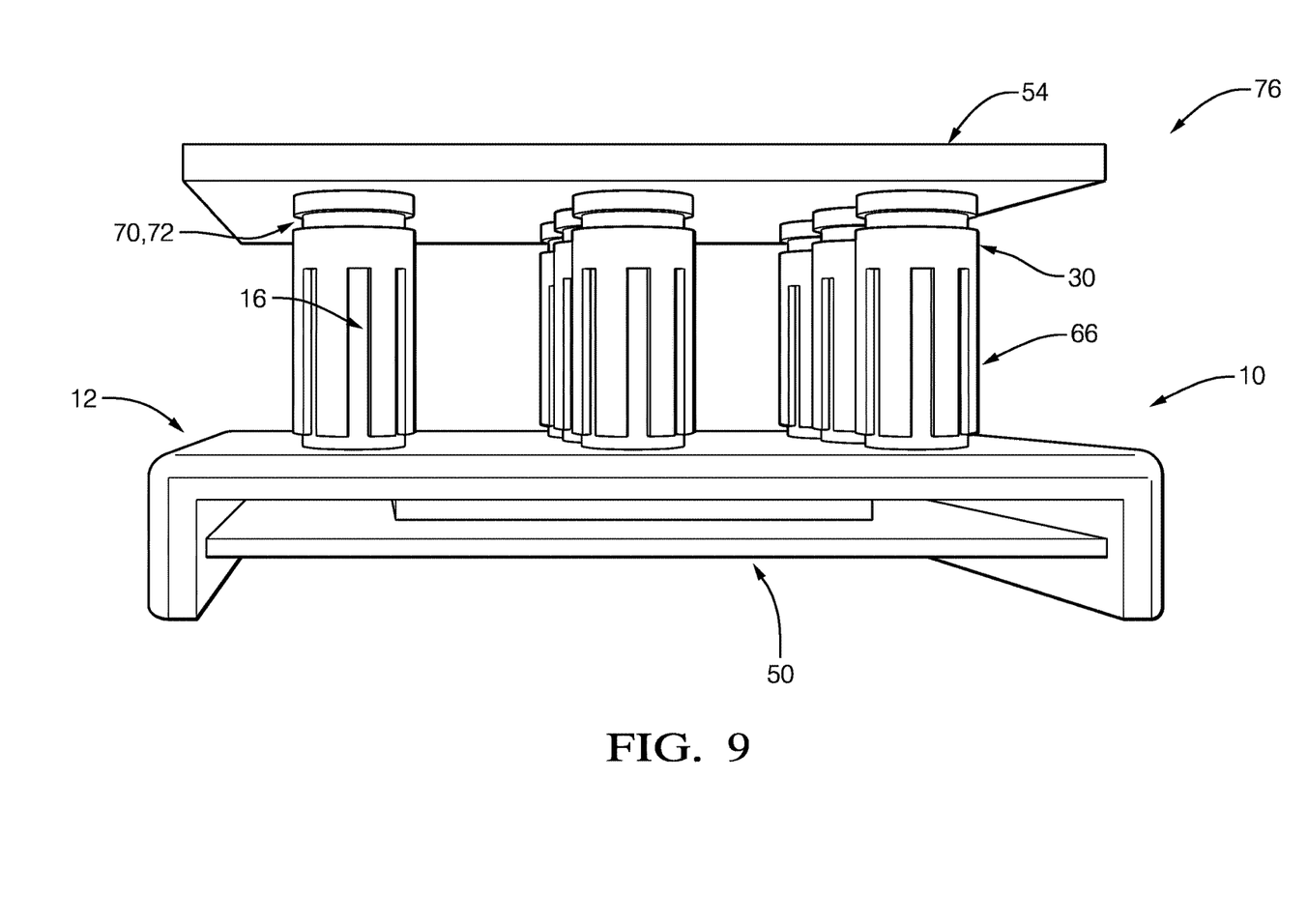
FIG. 9 is a schematic view of a second embodiment of an electronic assembly according to the invention, including the cooling device of FIG. 1 equipped with the blowing means rotationally controlled by the electronic control circuit arranged on the printed circuit board of FIG. 5.

A second embodiment of an electronic assembly 76 is shown in FIG. 9. This second embodiment differs from the first embodiment in that each hub 30 of the blowing means 66, mounted so as to be able to rotate on a pin-fin 16, is equipped with the two permanent magnets 70, 72 of opposing polarity, such as described in FIG. 7. According to this second embodiment, the hub 30 of each blowing means 66 is also mounted in rotation on the second printed circuit board 54. The second printed circuit board 54 is therefore positioned flat level above the pin-fins 16, but it is not in direct contact with the pin-fins 16. Specifically, according to the embodiment described in FIG. 2 and in FIG. 3, the hub 30 comprises, at its centre, on its lower face, a blind hole 34 and not a through hole.

However, an alternative to this embodiment could consist in that the hub 30 is equipped, at its centre, with a through hole, and that the free end 24 of the pin-fin 16 is of sufficiently large size, in the vertical direction, for it to be able to extend beyond the hub 30 in the vertical direction. The pin-fins 16 could thus serve as holding pins at the second printed circuit board 54.

As an alternative, the blowing means 40 described in FIG. 3, that is to say comprising blades 42, may also be equipped with permanent magnets 70, 72 on its hub 30, and may therefore also be mounted on the pin-fins 16 of the embodiment of FIG. 9. As well as increasing the flow of air around the pin-fins 16, the blades 42 may enable a blowing means 66 whose driving device 74 may be faulty to continue to rotate about the pin 16 on which it is mounted by exploiting the adjacent flows of air generated by the nearby blowing means 66.

While this invention has been described in terms of the preferred embodiments thereof, it is not intended to be so limited, but rather only to the extent set forth in the claims that follow.

We claim:

1. An electronic assembly comprising:
   a cooling device comprising a cooling plate equipped, on its upper face, with a plurality of pin-fins; and
   a first printed circuit board including at least one heat-generating zone bearing against a lower face of the cooling plate, wherein each pin-fin includes a blowing means comprising a hub equipped with blades, the blades being arranged axially along each pin-fin so as to be able to rotate about the pin-fin to create a flow of air for cooling the pins.

2. The electronic assembly according to claim 1, wherein each hub is mounted so as to be able to rotate on a pin-fin.

3. The electronic assembly according to claim 2, wherein each pin-fin has a cylindrical overall shape with a circular base.

4. The electronic assembly according to claim 1, wherein each pin-fin comprises, at a free end of each pin-fin, a shoulder on which the hub is mounted in abutment.

5. The electronic assembly according to claim 1, wherein the blades are formed by rectilinear rods extending from the hub as far as their free end.

6. The electronic assembly according to claim 5, wherein each rectilinear rod includes a blowing blade extending axially along each rod.

7. The electronic assembly according to claim 1, wherein the electronic assembly comprises a rotation-driving device controlled by an electronic control circuit arranged on a second printed circuit board.

8. The electronic assembly according to claim 7, wherein the second printed circuit board is arranged flat level above the free ends of the pin-fins.

9. The electronic assembly according to claim 8, wherein the electronic control circuit is arranged on the face of the second printed circuit board, facing the hubs.

10. The electronic assembly according to claim 8, wherein each hub is mounted in rotation on the second printed circuit board.

11. The electronic assembly according to claim 7, wherein the rotation-driving device is electromagnetic.

12. The electronic assembly according to claim 11, wherein the electromagnetic rotation-driving device comprises, for each blowing means, three coils arranged on the second printed circuit board, forming a magnetic stator; and two permanent magnets arranged on the hub, forming a magnetic rotor.

* * * * *